United States Patent [19]
Wong

[11] Patent Number: 5,701,234
[45] Date of Patent: Dec. 23, 1997

[54] SURFACE MOUNT COMPONENT FOR SELECTIVELY CONFIGURING A PRINTED CIRCUIT BOARD AND METHOD FOR USING THE SAME

[75] Inventor: Kenneth L. Wong, Sunnyvale, Calif.

[73] Assignee: Pacesetter, Inc., Sunnyvale, Calif.

[21] Appl. No.: 568,035

[22] Filed: Dec. 6, 1995

[51] Int. Cl.⁶ .................................................. H01R 9/09
[52] U.S. Cl. .......................... 361/773; 361/820; 257/695; 257/786
[58] Field of Search ................... 174/52.1, 52.4, 174/254, 260, 261; 257/678, 730, 690, 693, 695, 786; 361/760, 772, 773, 777, 820, 783, 813, 781, 806; 437/209, 220, 217; 439/68

[56] References Cited

U.S. PATENT DOCUMENTS 4,003,073  1/1977  Helda et al. ........................... 257/695

FOREIGN PATENT DOCUMENTS

| | | | |
|---|---|---|---|
| 2644268 | 9/1990 | France | 257/730 |
| 62-30356 | 2/1987 | Japan | 257/695 |
| 62-37952 | 2/1987 | Japan | 257/695 |
| 1-81328 | 3/1989 | Japan | 257/730 |
| 1-194449 | 8/1989 | Japan | 257/695 |
| 2-180059 | 7/1990 | Japan | 257/695 |
| 3-48449 | 3/1991 | Japan | 257/695 |
| 3-259558 | 11/1991 | Japan | 257/695 |
| 4-258144 | 9/1992 | Japan | 257/730 |
| 6-151670 | 5/1994 | Japan | 257/695 |

*Primary Examiner*—Donald Sparks
*Attorney, Agent, or Firm*—Steven M. Mitchell

[57] ABSTRACT

A surface mount component which can be mounted to a surface of a printed circuit board having a plurality of bonding pads connected to circuitry provided on the printed circuit board, which includes a puck having first and second wiring patterns, and a plurality of electrical connectors, a first set of electrical connectors being connected to the first wiring pattern, and a second set of the electrical connectors connected to the second wiring pattern. During the process of manufacturing a product which incorporates the printed circuit board, a production line worker can mount the puck to the surface of the printed circuit board in a selected one of a plurality of different possible positions, with at least selected ones of the first and second sets of electrical connectors being connected to respective ones of said bonding pads, to thereby achieve a selected one of a plurality of different selectable circuit configurations. A method for using the puck to achieve a selected one of a plurality of different selectable circuit configurations is also disclosed.

20 Claims, 8 Drawing Sheets

CONFIG 1: 1000
ID PIN 1 VCC
ID PIN 2 GND
ID PIN 3 GND
ID PIN 4 GND

CONFIG 2: 1110
ID PIN 1 VCC
ID PIN 2 VCC
ID PIN 3 VCC
ID PIN 4 GND

CONFIG 3: 0010
ID PIN 1 GND
ID PIN 2 GND
ID PIN 3 VCC
ID PIN 4 GND

CONFIG 4: 1010
ID PIN 1 VCC
ID PIN 2 GND
ID PIN 3 VCC
ID PIN 4 GND

CONFIG 5: 1011
ID PIN 1 VCC
ID PIN 2 GND
ID PIN 3 VCC
ID PIN 4 VCC

CONFIGURATION 1
ID PIN 1  GND
ID PIN 2  GND
ID PIN 3  VCC
ID PIN 4  GND

CONFIGURATION 2
ID PIN 1  VCC
ID PIN 2  GND
ID PIN 3  GND
ID PIN 4  VCC

CONFIGURATION 3
ID PIN 1  VCC
ID PIN 2  VCC
ID PIN 3  GND
ID PIN 4  VCC

CONFIGURATION 4
ID PIN 1  VCC
ID PIN 2  VCC
ID PIN 3  GND
ID PIN 4  GND

CONFIGURATION 5
ID PIN 1  GND
ID PIN 2  VCC
ID PIN 3  VCC
ID PIN 4  VCC (FACE-DOWN ORIENTATION)

CONFIGURATION 6
ID PIN 1  GND
ID PIN 2  VCC
ID PIN 3  GND
ID PIN 4  VCC (FACE-DOWN ORIENTATION)

CONFIGURATION 7
ID PIN 1   VCC
ID PIN 2   GND
ID PIN 3   GND
ID PIN 4   GND (FACE-DOWN ORIENTATION)

CONFIGURATION 8
ID PIN 1   VCC
ID PIN 2   VCC
ID PIN 3   VCC
ID PIN 4   GND (FACE-DOWN ORIENTATION)

CONFIGURATION 9
ID PIN 1   GND
ID PIN 2   GND
ID PIN 3   VCC
ID PIN 4   VCC (FACE-DOWN ORIENTATION)

CONFIGURATION 10
ID PIN 1   GND
ID PIN 2   VCC
ID PIN 3   GND
ID PIN 4   GND

SURFACE MOUNT COMPONENT FOR SELECTIVELY CONFIGURING A PRINTED CIRCUIT BOARD AND METHOD FOR USING THE SAME

BACKGROUND OF THE INVENTION

The present invention relates generally to devices for selectively configuring circuitry printed on a printed circuit board (PCB), and, more particularly, to a surface mount component which can be mounted on the surface of a PCB in a selected one of a plurality of different positions, to thereby selectively configure the circuitry printed thereon, and a method for using the same.

In general, a PCB is an insulating (e.g., epoxy glass or ceramic) substrate or board onto which a circuit or wiring pattern has been printed by any of several graphic art processes. The board may be multi-layered, with each layer having a different printed circuit pattern connected to external leads, contact pads and/or other circuit layers through conductive vias. Separate components, e.g., memory devices, microprocessors, and other external components can be attached to the PCB. Generally, there are two different techniques for attaching external components to the PCB. The first technique is to attach a component having longitudinally extending leads through plated-through holes provided in the board. This is generally accomplished by soldering the leads to the plated-through holes or eyelets. The second technique is to attach an external component to a surface of the PCB provided with bonding pads which are interconnected to different portions of the printed circuit through printed conductors or traces having very narrow line-widths. This is generally accomplished by soldering, swaging, or brazing external leads of the external component to the bonding pads (or lands) provided on the mounting surface of the PCB. For this reason, this technique is commonly referred to as a surface mount technique, and this technology is commonly referred to as surface mount technology (SMT).

Rapid advancements in PCB technology, e.g., increased resolution step-and-repeat photographic reduction equipment, have enabled a significant increase in the achievable circuit density of the PCB. Further, rapid advancements in high-density microelectronics packaging technology has resulted in surface mount components having very high pin counts. More particularly, the circuit density of integrated circuits (ICs) fabricated in semiconductor chips and encapsulated in various types of semiconductor packages has increased dramatically in recent years, resulting in miniaturized packaged chips having a large number of closely-spaced external leads or pins. These external leads or pins are soldered, brazed, or otherwise bonded to the bonding pads provided on the mounting surface of the PCB. In order to increase the flexibility or versatility of any given part, the pins of these packaged IC chips (e.g., memory chips, microprocessors, ASICs, etc.) can be configured in any of a variety of possible circuit configurations, to thereby achieve any of a variety of different functionalities. In this way, a single packaged IC chip having a plurality of different possible circuit configurations can be manufactured rather than a variety of packaged IC chips each having a different hard-wired circuit configuration, thereby substantially reducing the complexity and cost of manufacturing such products. In short, a general-purpose IC having a variety of selectable functionalities can be mass-produced at much lower cost than a plurality of specialty ICs having a single hard-wired functionality.

Similarly, PCBs are now manufactured which have this built-in flexibility or versatility. More particularly, PCBs are available which have a pattern of conductors, sometimes referred to as a wiring pattern, which provide point-to-point interconnections to different circuit elements or portions of the printed circuit and/or external components mounted thereto. Each of these conductors terminates in a different bonding pad. A variety of different conductor routings and thus circuit configurations can be achieved by interconnecting different combinations of the bonding pads using jumper wires soldered or otherwise attached thereto. Thus, rather than manufacturing a number of different PCBs each having a different hard-wired circuit configuration, it is possible to manufacture a single, general purpose PCB having a plurality of different possible circuit configurations, thereby reducing the cost and complexity of manufacturing such products.

Although the presently available technique of using jumper wires to achieve different circuit configurations is useful, it suffers from the following drawbacks and shortcomings. First, the jumper wires must each be connected to the proper bonding pads by production line workers during the manufacturing process, and thus, given the number of possible combinations, the likelihood of worker error is relatively high. Second, the time required to make the necessary connections of the jumper wires to the bonding pads is relatively great, thereby increasing the cost of manufacturing. Third, the surface area required to accommodate the plurality of jumper wires which are required to achieve this flexibility is relatively great, thereby limiting the achievable miniaturization of the PCB, and thus, of the product which incorporates the PCB.

Based on the above, it can be appreciated that there presently exists a need in the art for a technology which overcomes the above-described drawbacks and shortcomings of the presently available technology for selectively configuring the circuitry of a PCB. The present invention fulfills this need.

SUMMARY OF THE INVENTION

The present invention encompasses a surface mount component which can be mounted to a surface of a printed circuit board having a plurality of bonding pads connected to circuitry provided on the printed circuit board, which includes a puck having first and second wiring patterns, and a plurality of electrical connectors, a first set of electrical connectors being connected to the first wiring pattern, and a second set of the electrical connectors being connected to the second wiring pattern. During the process of manufacturing a product which incorporates the printed circuit board, a production line worker can mount the puck to the surface of the printed circuit board in a selected one of a plurality of different possible positions, with at least selected ones of the first and second sets of electrical connectors being connected to respective ones of the bonding pads, to thereby achieve a selected one of a plurality of different selectable circuit configurations.

In the presently preferred embodiment, the puck includes a first dielectric layer having the first wiring pattern printed on a first surface thereof and the second wiring pattern printed on a second, opposite surface thereof, and a second dielectric layer laminated to the first surface of the first dielectric layer, with the electrical connectors being provided on an exposed surface of the second dielectric layer. A third dielectric layer may optionally be laminated to the second surface of the first dielectric layer, to thereby provide a multi-layer structure.

In the presently preferred embodiment, the puck is a disc-shaped member, and the electrical connectors are a plurality of leads which fan out in a circular pattern around the periphery of the puck, with an equal angular spacing therebetween. In an alternative embodiment, the puck is polygonal. The plurality of different possible positions of the puck may include a plurality of different combinations of angular and face up/down orientations of the puck. The puck can be provided with both angular orientation indicia (e.g., index marks on the front and back surfaces of the puck) and up/down indicia, to thereby facilitate quick and easy orientation of the puck in a selected position by a production line worker, e.g., by reference to an operation/assembly or process flow sheet.

Because the footprint of the puck of the present invention is much smaller than the footprint required to accommodate the multiple jumper wires of the presently available technology, the size of the PCB and the product incorporating the PCB can be commensurately reduced. In products such as implantable medical devices, e.g., implantable cardioverter-defibrillators (ICDs), this miniaturization is very important and much-sought. Further, the time required by the production line worker to properly position the jumper puck of the present invention and attach the leads thereof to the PCB is significantly less than the time required to properly position and connect multiple jumper wires, thereby decreasing manufacturing cost. Additionally, since the production line worker need only align a single index mark in order to properly position the jumper puck of the present invention, the complexity of the manufacturing process is greatly reduced, and the likelihood of worker error is greatly diminished, thereby further decreasing manufacturing cost and product reliability.

The present invention also encompasses a method for using the puck to achieve a selected one of a plurality of selectable circuit configurations of a printed circuit board.

BRIEF DESCRIPTION OF THE DRAWINGS

These and other various other features and advantages of the present invention will be more clearly understood from the following detailed description taken in conjunction with the accompanying drawings, in which.

DETAILED DESCRIPTION OF THE INVENTION

Figure 1:
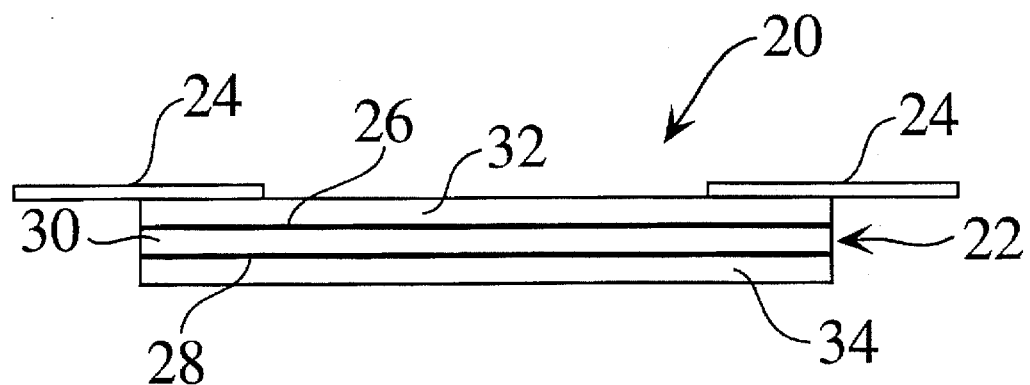
FIG. 1 is a cross-sectional view of a jumper puck constructed in accordance with a presently preferred embodiment of the present invention.

In overview, the present invention encompasses a surface mount technology (SMT) component or element which can be mounted on the surface of a printed circuit board (PCB) in any one of a plurality of different positions, to thereby achieve a selected circuit configuration. In the presently preferred embodiment, the SMT component is a generally disc-shaped or circular member or element which can be alternatively referred to as a disc, button, or puck. For ease of description, this element will be referred to hereinafter as a puck. The puck can be of any desired specific shape and size, and can be constructed in any convenient manner which will hereinafter become apparent to those skilled in the pertinent art. The specific size, shape, and construction selected will vary depending upon the specific application. Further, although the puck of the presently preferred embodiment is circular, it will be appreciated that the puck can also be polygonal. The only requirement is that the footprint of the puck match the footprint of the mounting area provided on the surface of the PCB for reception of the puck.

In general, the puck includes at least first and second conductor or wiring patterns which are electrically connected to respective first and second sets of a plurality of spaced-apart leads (or other contact elements, e.g., edge contacts) provided about the perimeter of the puck. During the manufacturing process, a production line worker can mount the puck to the designated mounting area provided on the surface of the PCB in a selected position, e.g., in accordance with an operation/assembly or process flow sheet, in order to achieve a desired circuit configuration. In this connection, the leads of the puck will be soldered, brazed, or otherwise attached to corresponding bonding pads provided on the surface of the PCB. The particular circuit configuration achieved will depend upon the angular orientation or position of the puck, and, in an alternative embodiment, also upon the face up/down orientation of the puck. In the preferred embodiment, an index or locator mark (or other orientation key) is provided on the front face of the puck to facilitate easy and accurate orientation of the puck in the proper rotational or angular position for achieving the desired circuit configuration.

Thus, the puck of the present invention performs the function of the plurality of jumper wires ("jumpers") which have been used heretofore to achieve circuit configuration selectability. As such, the puck of the present invention can be referred to as a "jumper puck". Because the footprint of the puck of the present invention is much smaller than the footprint required to accommodate the multiple jumper wires of the presently available technology, the size of the PCB and the product incorporating the PCB can be commensurately reduced. In products such as implantable medical devices, e.g., implantable cardioverter-defibrillators (ICDs), this miniaturization is very important and much-sought. Further, the time required by the production line worker to properly position the jumper puck of the present invention and attach the leads thereof to the PCB is significantly less than the time required to properly position and connect multiple jumper wires, thereby decreasing manufacturing cost. Additionally, since the production line worker need only align a single index mark in order to properly position the jumper puck of the present invention, the complexity of the manufacturing process is greatly reduced, and the likelihood of worker error is greatly diminished, thereby further decreasing manufacturing cost.

Figure 2:
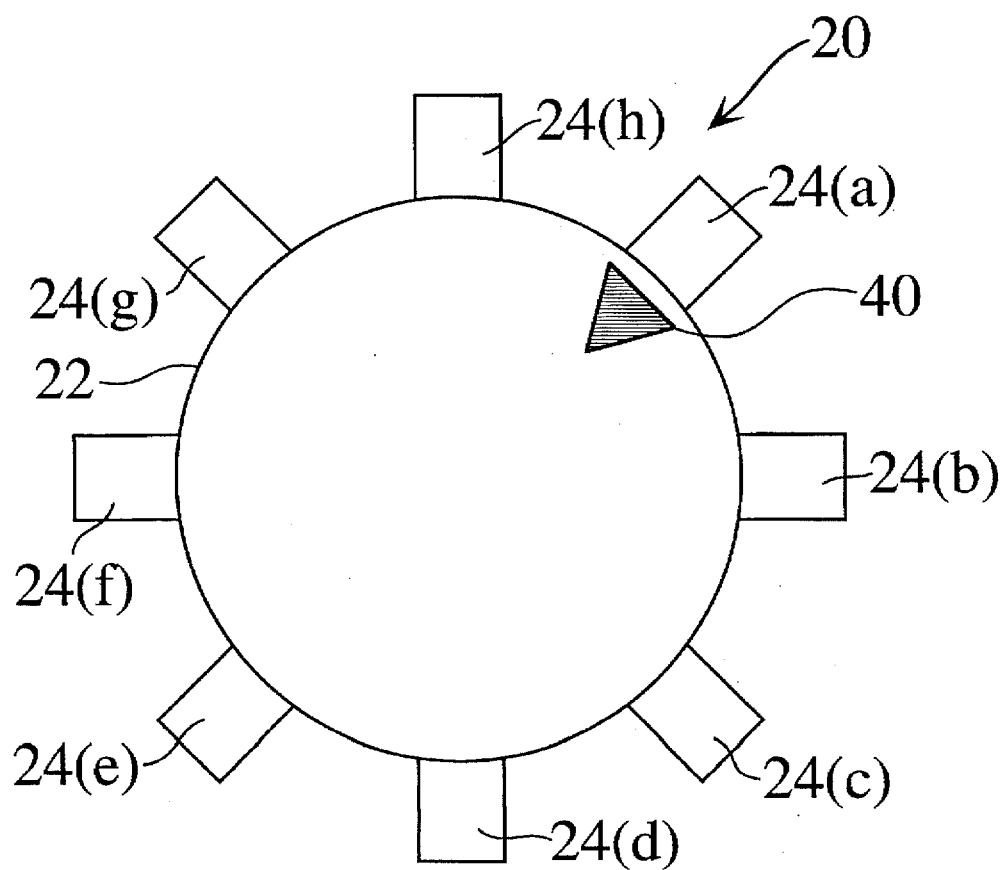
FIG. 2 is a top plan view of the jumper puck of a presently preferred embodiment of the present invention.

With reference now to FIGS. 1 and 2, there can be seen a jumper puck 20 which constitutes the presently preferred embodiment of the present invention. The jumper puck 20 is of circular shape and has a plurality (e.g., eight) of leads 24 (a–h) extending radially outwardly from the circumferential edge 22 thereof. As can be seen in FIG. 2, the leads 24 fan out in a circular pattern, with an equal angular spacing therebetween. The jumper puck 20 is preferably a laminated, multi-layer structure comprised of a first dielectric layer 30 having first and second printed wiring pattern 26, 28 printed on opposite faces thereof, a second dielectric layer 32 bonded to a first face of the first dielectric layer 30, with the first printed wiring pattern 26 sandwiched therebetween, and a third dielectric layer 34 bonded to a second face of the first dielectric layer 30, with the second printed wiring pattern 28 sandwiched therebetween. The first, second, and third dielectric layers 30, 32 and 34 are each made of an electrically insulating material, such as ceramic, plastic, epoxy glass, or other suitable dielectric material. The leads 24 can be formed in any well-known manner, e.g., by pattern-etching a conductive layer (e.g., a copper layer) formed on the exposed face of the second dielectric layer 32, and then using a monolithic electroplating process to plate-up the resultant leads 24 to a thickness sufficient to provide the required mechanical strength. Alternatively, the leads 24 can be brazed onto the exposed face of the second dielectric layer 32, in which case, the second dielectric layer 32 is preferably comprised of a ceramic material. The first and second printed wiring patterns 26, 28 can be formed in any well-known manner, e.g., by pattern-etching conductive layers (e.g., copper layers) formed on the opposite faces of the first dielectric layer 30. The leads 24 are preferably made of copper or any other suitable conductive material, and are preferably plated with gold, tin-lead alloy, or any other suitable solder-plating material, to thereby enhance the solderability of the leads 24.

Figure 3:
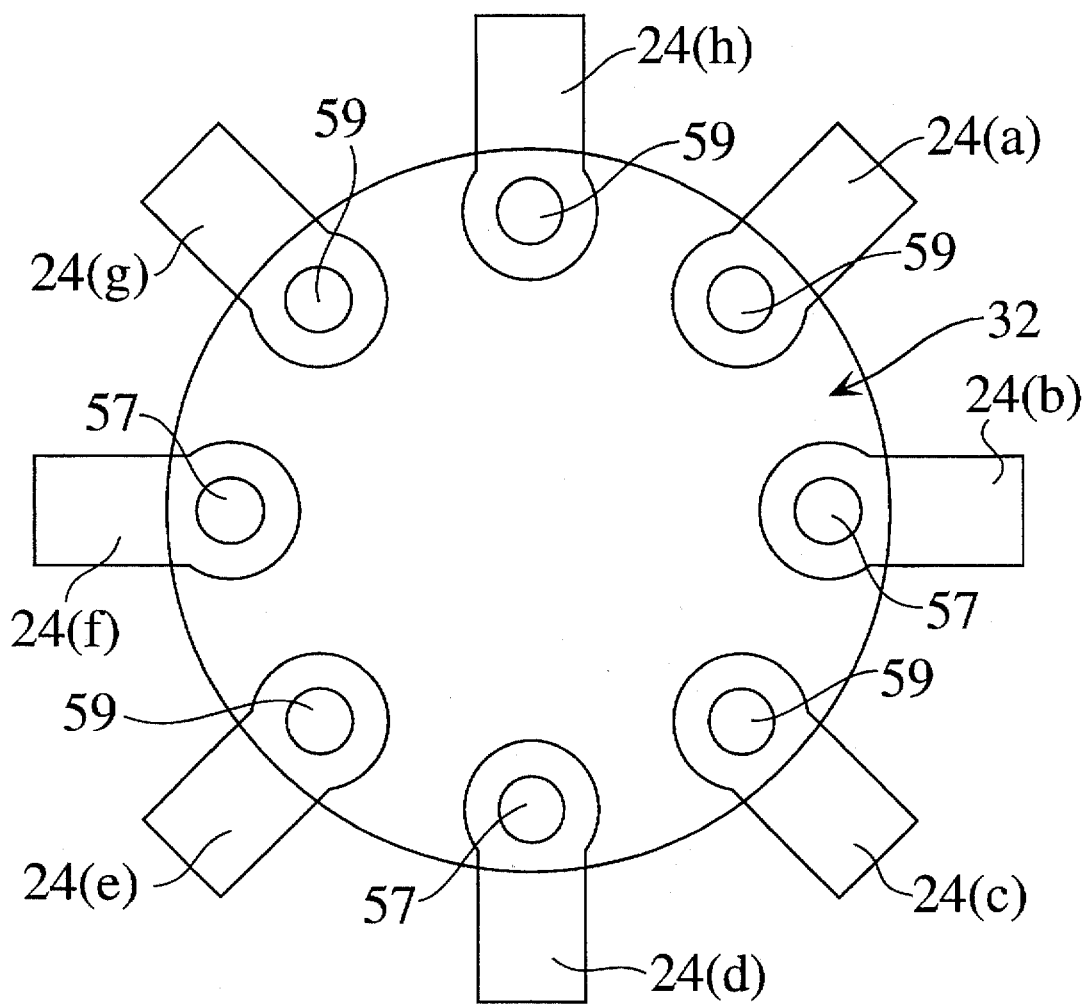
FIG. 3 is a bottom plan view of the jumper puck of a presently preferred embodiment of the present invention.
Figure 4:
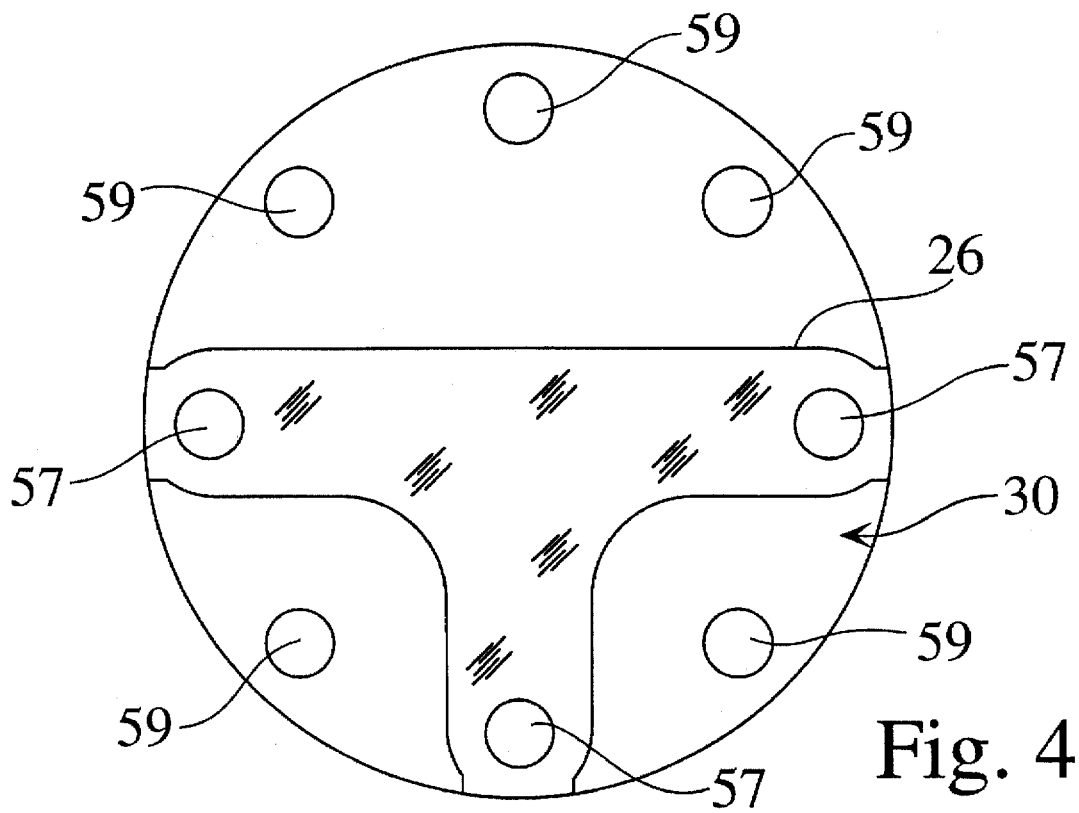
FIG. 4 is an isolation, top plan view of a first dielectric layer of the jumper puck of the presently preferred embodiment of the present invention.
Figure 5:
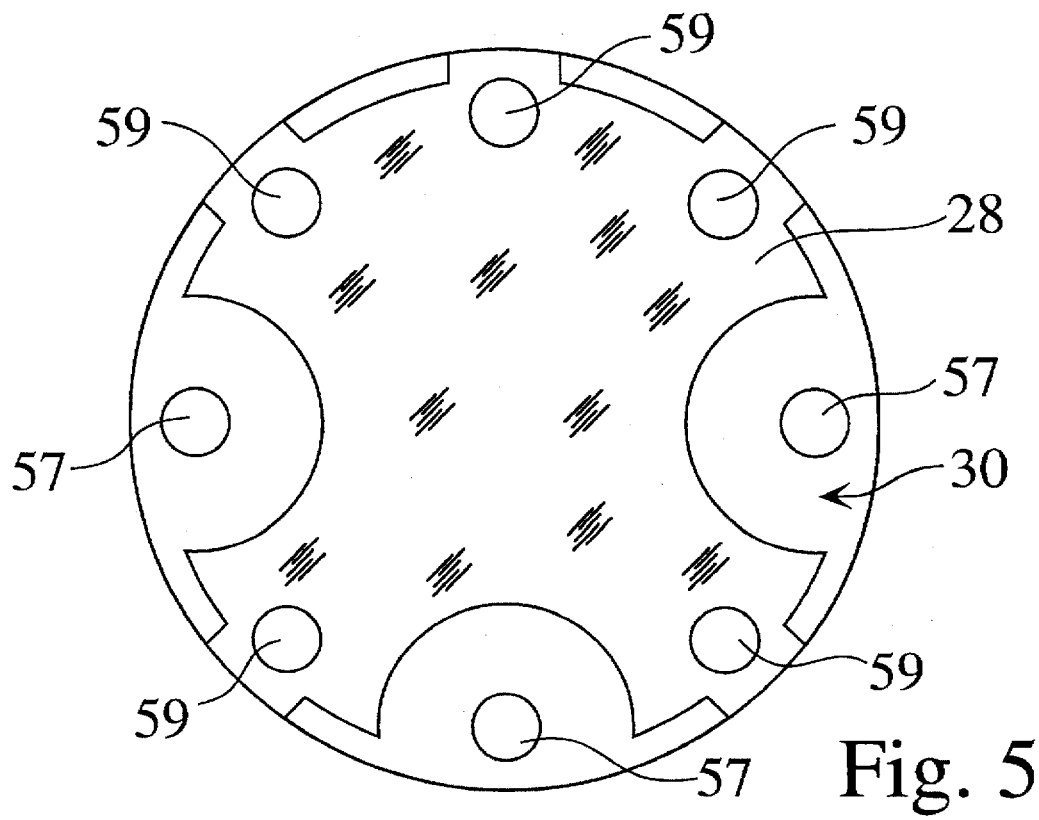
FIG. 5 is an isolation, bottom plan view of the first dielectric layer depicted in FIG. 4.

The resultant multi-layer structure constituting the jumper puck 20 can be laminated together using any well-known lamination process. Each of the layers (30, 32, 34) (plies/laminations) of the jumper puck 20 may be flexible or rigid. As can be seen in FIGS. 3–5, the first printed wiring pattern 26 is electrically connected to a first set (e.g., b, d, f) of the leads 24 through a corresponding first set of plated-through holes 27 formed in the first and second dielectric layers 30, 32, and the second printed wiring pattern 28 is electrically connected to a second set (e.g., a, c, e, g, h) of the leads 24 through a corresponding second set of plated-through holes 29 formed in the first and second dielectric layers 30, 32.

Various other fabrication techniques can be utilized which are well-known to those skilled in the pertinent art. In general, the specific method employed to fabricate the jumper puck 20 of the present invention is not limiting thereto. Further, the specific construction of the jumper puck 20 is not limiting to the present invention, as many other alternative constructions which will be readily apparent to those skilled in the pertinent art are possible. For example, a protective coating may be applied over the second printed wiring pattern 28 and the third dielectric layer 34 eliminated, or alternatively, the first printed wiring pattern 26 may be formed on the front side of the first dielectric layer 30, and the second printed wiring pattern 28 may be formed on the front side of the third dielectric layer 34.

Figure 6:
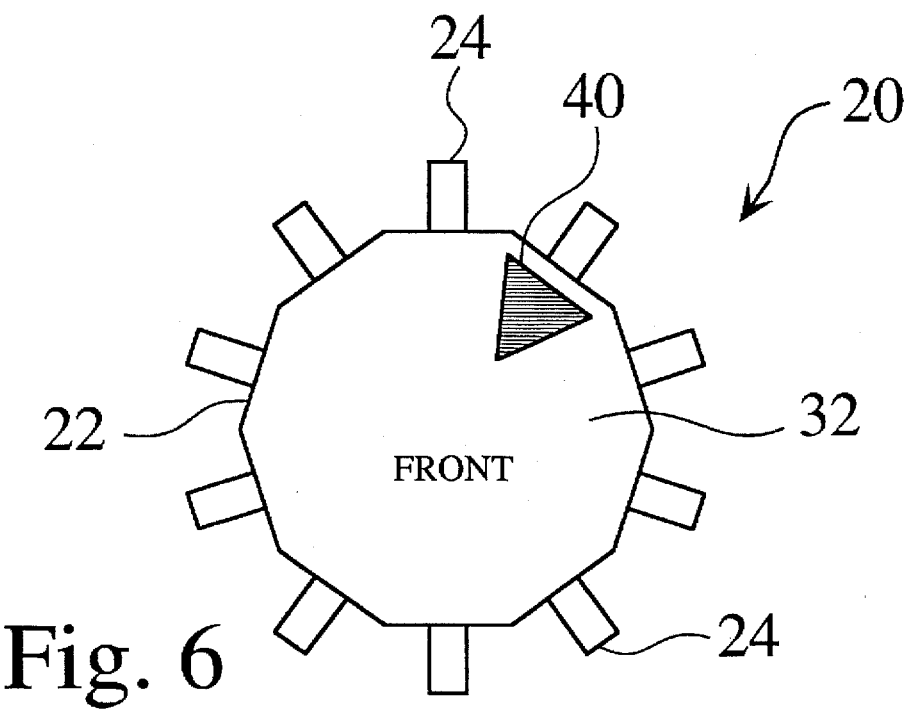
FIG. 6 is a top plan view of the jumper puck of an alternative embodiment of the present invention.
Figure 7:
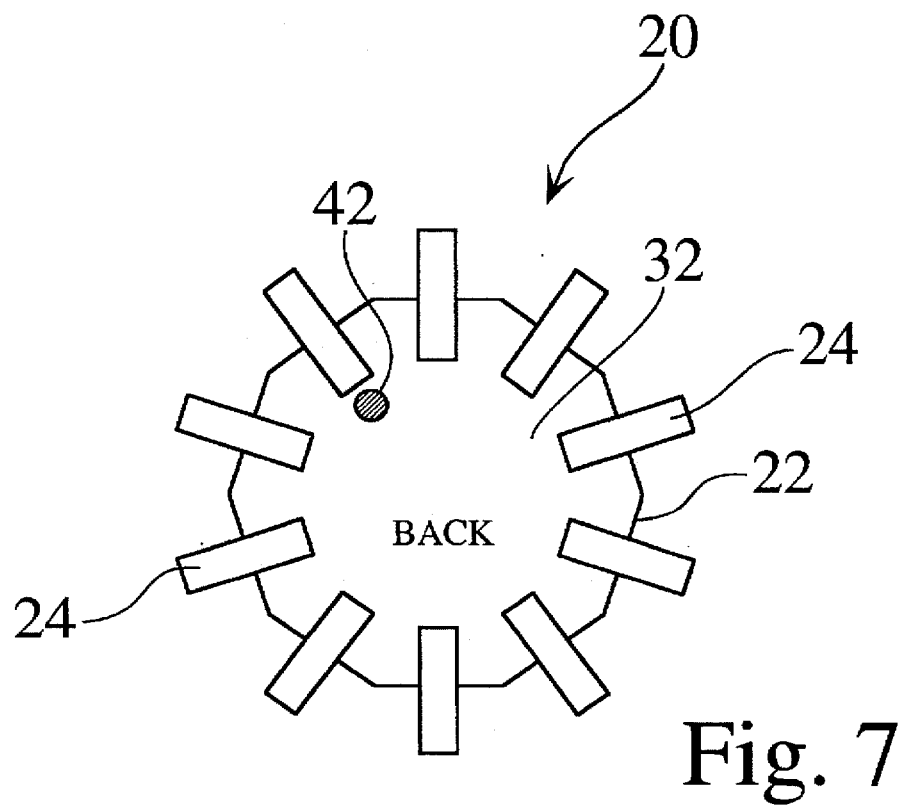
FIG. 7 is a bottom plan view of the jumper puck depicted in FIG. 6.
Figure 8A:
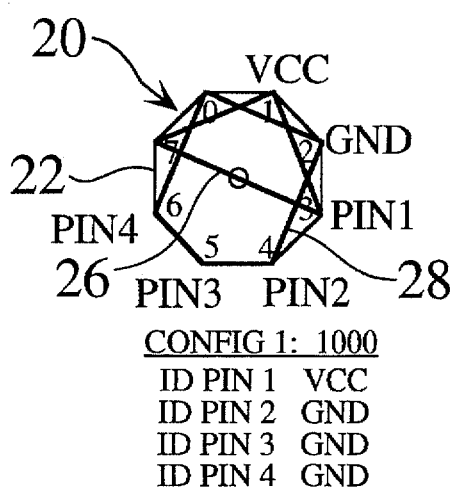
FIGS. 8A–8E are a series of representational diagrams of a presently contemplated implementation of the jumper puck of the present invention, illustrating five respective possible circuit configurations which can be achieved therewith; and, FIGS. 9A–9J are a series of representational diagrams of an exemplary alternative implementation of the jumper puck of the present invention, illustrating ten respective possible circuit configurations which can be achieved therewith.
Figure 8B:
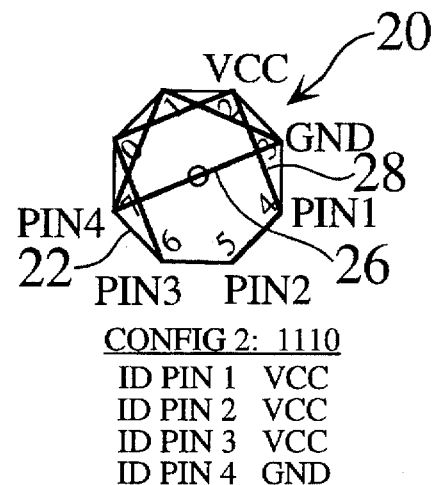
Figure 8C:
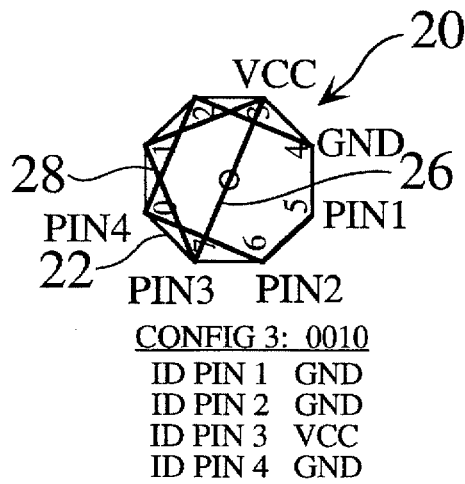
Figure 8D:
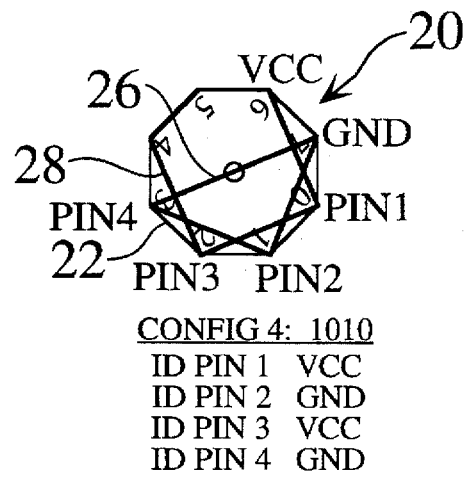
Figure 8E:
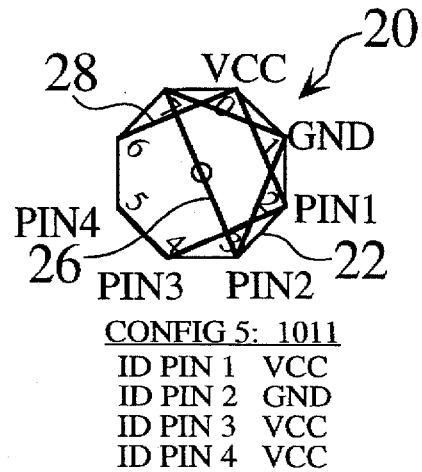
Figure 9A:
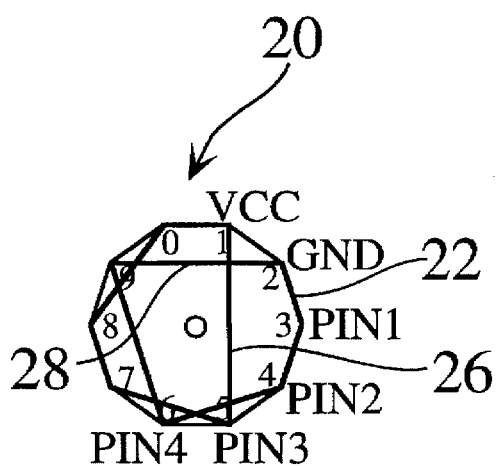
Figure 9B:
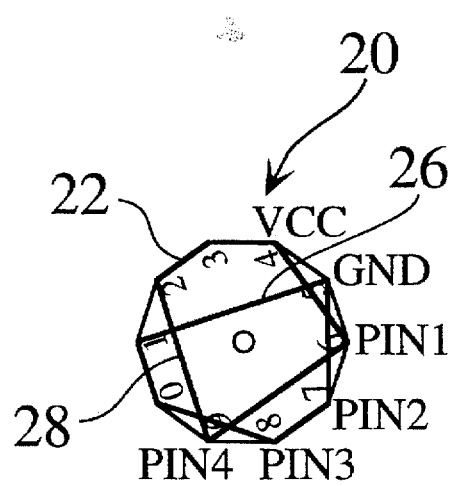
Figure 9C:
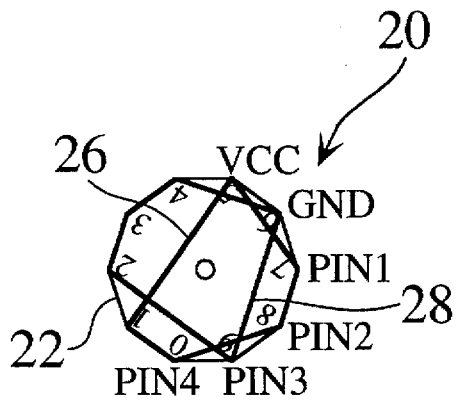
Figure 9D:
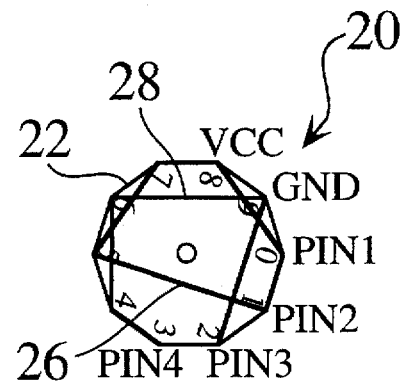
Figure 9E:
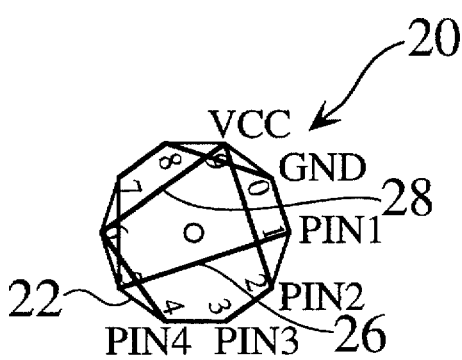
Figure 9F:
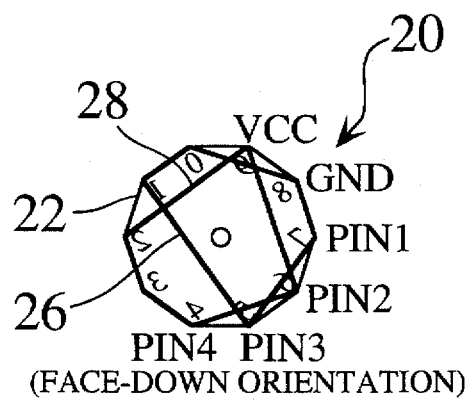
Figure 9G:
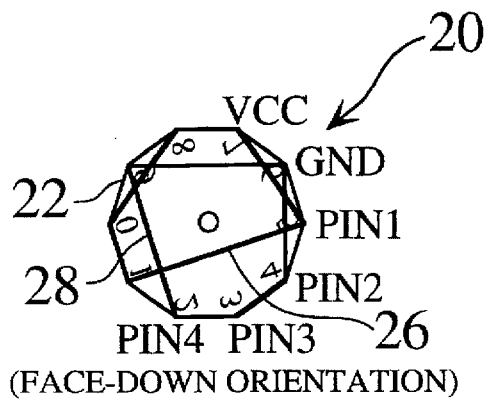
Figure 9H:
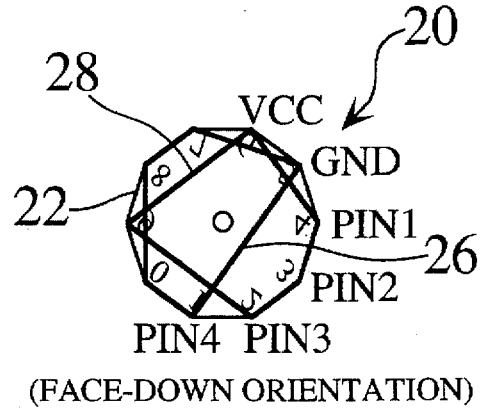
Figure 9I:
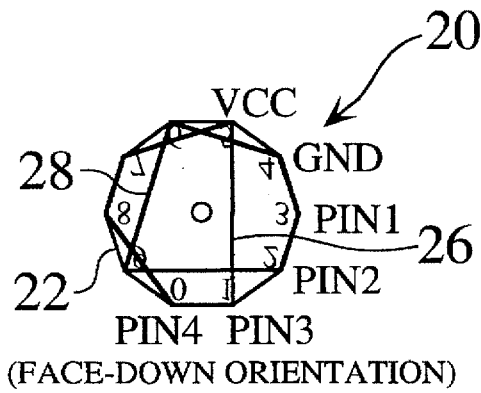
Figure 9J:
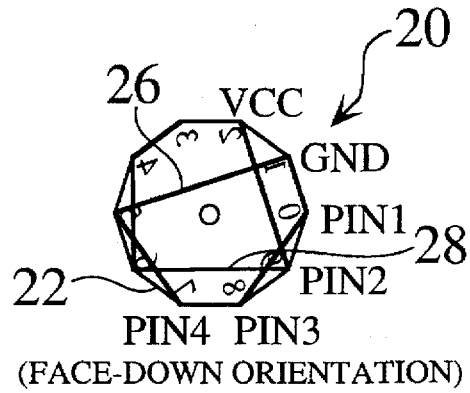

In an alternative embodiment of the present invention, opposite faces of the jumper puck 20 are provided with different identifying characteristics in order to facilitate easy differentiation thereof. More particularly, the exposed face of the second dielectric layer 32, which constitutes one face of the jumper puck 20, is preferably marked "FRONT", and the exposed face of the third dielectric layer 34, which constitutes the other face of the jumper puck 20, is preferably marked "BACK", as can be seen in FIGS. 6 and 7. For example, the markings "FRONT" and "BACK" may be silkscreened onto the respective opposite faces of the jumper puck 20 using different color silkscreens, e.g., white and yellow.

In the preferred embodiment of the present invention, an index or angular orientation mark (locator key) is preferably provided on the front face of the jumper puck 20. In the alternative embodiment, an index mark is preferably provided on both the front and back faces of the jumper puck 20, with the index mark provided on one face of the jumper puck 20 preferably being of a different shape and/or color than the index mark provided on the opposite face of the jumper puck 20. For example, as can be seen in FIGS. 6 and 7, a triangular index mark 40 can be silkscreened onto the "FRONT" face of the jumper puck 20, e.g., using white silkscreen, and a circular index mark 42 can be silkscreened onto the "BACK" face of the jumper puck 20, e.g., using yellow silkscreen. Of course, neither the specific type of identification indicia used to distinguish the opposite faces of the jumper puck 20 (i.e., to indicate face orientation), nor the specific type of indicia used to indicate the angular position or orientation of the jumper puck 20 is limiting to the present invention.

It is presently contemplated that the jumper puck 20 of the present invention will be used in the manufacture of implantable cardioverter-defibrillators (ICDs) to facilitate the simple and cost-effective production of different model ICDs, each with a different circuit configuration determined by the angular orientation (and, in the alternative embodiment, the face up/down orientation) of the jumper puck 20 mounted to the surface of a PCB (not shown) which is incorporated within the ICD. More particularly, during the manufacturing process, a production line worker need only mount the jumper puck 20 to the surface of the PCB with the angular or rotational orientation (and, in the alternative embodiment, the face up/down orientation) specified by an operation/assembly or process flow sheet for the particular circuit configuration, and thus, ICD model which it is desired to manufacture. For example, the production line worker can easily position the jumper puck 20 in the mounting area on the surface of the PCB with the specified angular and face up/down orientation by using the index marks 40 and 42 and the "FRONT" and "BACK" markings provided on the opposite faces of the puck 20.

With reference now to FIGS. 8A–8E, a presently contemplated implementation of the jumper puck 20 will now be described. For ease of illustration, the jumper puck 20 is depicted in the representational diagrams of FIGS. 8A–8E as an octagon, with the nodes or corners formed by the adjoining sides thereof being numbered 0–7 to denote the corresponding leads 24a–h (which are omitted from FIGS. 8A–8E for ease of illustration). The various bonding pads on the surface of the PCB (not shown) on which the jumper puck 20 is mounted are denoted in FIGS. 8A–BE by the designations of pins of a microprocessor (not shown) to which these bonding pads are connected, i.e., VCC, GND, PIN1, PIN2, PIN3, and PIN4. In this case, the pins designated PIN1-PIN4 are product ID pins.

The first and second printed wiring patterns 26 and 28, respectively, are shown schematically in FIGS. 8A–8E as intersecting lines on a common surface, whereas these wiring patterns are, in actuality, as described hereinabove, internal wiring patterns which are separated by a dielectric layer. With specific reference to FIG. 4, the first printed wiring pattern 26 is connected to a first set (b, d, and f) of the leads 24. This is represented in FIGS. 8A–8E by a zig-zag line 26 connected to a first set of nodes (1, 3, and 7). With specific reference to FIG. 5, the second wiring pattern 28 is connected to a second set (a, c, e, g, and h) of the leads 24. This is represented in FIGS. 8A–8E by a zig-zag line 28 connected to a second set of nodes (0, 2, 4, 5, and 6).

With continuing reference to FIGS. 8A–8E, five different possible circuit configurations can be achieved by mounting the jumper puck 20 of this presently contemplated implementation to the surface of the PCB in a corresponding number of different angular positions or orientations. More particularly, with specific reference to FIG. 8A, in the first possible circuit configuration, PIN2, PIN3, and PIN4 are connected to ground (GND), and PIN1 is connected to the power supply (VCC). With specific reference to FIG. 8B, in the second possible circuit configuration, PIN1, PIN2, and PIN3 are connected to VCC, and PIN 4 is connected to GND. With specific reference to FIG. 8C, in the third possible circuit configuration, PIN1, PIN2, and PIN4 are connected to GND, and PIN3 is connected to VCC. With specific reference to FIG. 8D, in the fourth possible circuit configuration, PIN2 and PIN4 are connected to GND, and PIN1 and PIN3 are connected to VCC. With specific reference to FIG. 8E, in the fifth possible circuit configuration, PIN1, PIN3, and PIN4 are connected to VCC, and PIN2 is connected to GND.

With reference now to FIGS. 9A–9J, an alternative exemplary implementation of the jumper puck 20 will now be described. More particularly, the jumper puck 20 of this specific implementation is a ten-sided polygon, with the nodes or corners formed by adjoining sides being numbered 0–9 in the representational diagrams of FIGS. 9A–9J to denote the corresponding leads (which are omitted from FIGS. 9A–9J to facilitate ease of illustration of the invention). The various bonding pads on the surface of the PCB (not shown) on which the jumper puck 20 is mounted are denoted in the representational diagrams of FIGS. 9A–9J by the designations of the pins of a microprocessor (not shown) to which these bonding pads are connected, i.e., VCC, GND, PIN1, PIN2, PIN3 and PIN4. In this example, the pins designated PIN 1–PIN4 are product ID pins. The first and second printed wiring patterns 26 and 28, respectively, are shown schematically in FIGS. A–9J as intersecting lines on a common surface, whereas these wiring patterns are, in actuality, as described hereinabove, internal wiring patterns which are separated by a dielectric layer. With this alternative implementation, the first wiring pattern 26 is connected to a first set of nodes (and thus leads) 0, 1, 5, 7, and 8, and the second wiring pattern 28 is connected to a second set of nodes (and thus leads) 2, 3, 4, 6, and 9.

With continuing reference to FIGS. 9A–9J, ten different possible circuit configurations can be achieved by mounting the jumper puck 20 of the exemplary implementation to the surface of the PCB in a corresponding number of different angular orientation-face up/down orientation combinations. More particularly, with specific reference to FIG. 9A, in the first possible circuit configuration, PIN 1, PIN 2 and PIN 4 are connected to ground (GND), and PIN 3 is connected to the power supply (VCC). With specific reference to FIG. 9B, in the second possible circuit configuration, PIN 1 and PIN 4 are connected to VCC, and PIN 2 and PIN 3 are connected to GND. With specific reference to FIG. 9C, in the third possible circuit configuration, PIN 1, PIN 2, and PIN 4 are connected to VCC, and PIN 3 is connected to GND. With specific reference to FIG. 9D, in the fourth possible circuit configuration, PIN 1 and PIN 2 are connected to VCC, and PIN 3 and PIN 4 are connected to GND. With specific reference to FIG. 9E, in the fifth possible circuit configuration, PIN 2, PIN 3, and PIN 4 are connected to VCC, and PIN 1 is connected to GND. With specific reference to FIG. 9F, in the sixth possible circuit configuration, PIN 2 and PIN 4 are connected to VCC, and PIN 1 and PIN 3 are connected to GND. With specific reference to FIG. 9G, in the seventh possible circuit configuration, PIN 2, PIN 3, and PIN 4 are connected to GND, and PIN 1 is connected to VCC. With specific reference to FIG. 9H, in the eighth possible circuit configuration, PIN 1, PIN 2, and PIN 3 are connected to VCC, and PIN 4 is connected to GND. With specific reference to FIG. 9I, in the ninth possible circuit configuration, PIN 1 and PIN 2 are connected to GND, and PIN 3 and PIN 4 are connected to VCC. With specific reference to FIG. 9J, in the tenth possible circuit configuration, PIN 1, PIN 3, and PIN 4 are connected to GND, and PIN 2 is connected to VCC.

In order to mount the jumper puck 20 to the surface of the PCB, the production line worker may have to slightly bend the leads 24 in order to solder the leads to the bonding pads on the surface of the PCB, if the jumper puck 20 is mounted in the "BACK" face up orientation, since the leads 24 will be spaced from the plane of the PCB by the thickness of the puck 20. In this connection, the jumper puck 20 can be made quite miniature, e.g., 0.25" diameter, and 0.020" thickness, so that the amount of bending required will be quite minimal. Alternatively, the leads 24 can be pre-bent into any desired shape or configuration, e.g., gull-wing leads can be employed. Further, edge contacts (not shown), J-leads (not shown), or any other suitable type of electrical connector means may be employed in lieu of the straight leads 24 of the presently preferred embodiment. Additionally, dummy bonding pads (not shown) can be provided in the puck mounting area on the surface of the PCB to accommodate any leads 24 which are unused, i.e., not connected (e.g., soldered) to bonding pads which are connected to active circuit elements. The terminology "dummy bonding pads" as used herein is intended to mean "bonding pads that are not electrically connected to any active circuitry on the PCB". For example, with the exemplary implementation of the jumper puck 20 illustrated in FIGS. 9A–9J, any leads which are not soldered to the bonding pads which are connected to the pins VCC, GND, and PINS 1–4 of the microprocessor, are not used. The provision of dummy bonding pads and the soldering of unused leads thereto serves to enhance the stability and reliability of the attachment of the jumper puck 20 to the PCB. Also, the first set of leads 24 connected to the first printed wiring pattern 26 can be provided on one face of the puck 20, and the second set of leads 24 connected to the second printed wiring pattern 26 can be provided on the opposite face of the puck 20.

It should be noted that for any printed wiring pattern design, not all possible rotational orientations of the puck are unique or acceptable, e.g., an orientation that would result in the power supply being connected to ground. Of course, it will be readily understood by those skilled in the pertinent art that there are a virtually limitless number of possible jumper puck designs, e.g., with respect to size, shape, number of sides, number of leads, and printed wiring pattern designs, and that the number of possible selectable circuit configurations are likewise virtually limitless. In this regard, the particular design selected will be based upon the specific application and requirements therefor. For example, in the first example given above and illustrated in FIGS. 9A–9J, an eight-leaded jumper puck is used to achieve five possible circuit configurations, and in the second example given above, a ten-leaded jumper puck is used to achieve ten possible circuit configurations. In general, although a presently preferred embodiment of the present invention has been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. A surface mount component which can be mounted to a surface of a printed circuit board having a plurality of bonding pads connected to circuitry provided on the printed circuit board, comprising:

a puck having first and second wiring patterns, and a plurality of electrical connectors, a first set of electrical connectors being connected to said first wiring pattern, and a second set of said electrical connectors connected to said second wiring pattern; and, wherein said puck can be mounted to the surface of the printed circuit board in a selected one of a plurality of different possible positions, with at least selected ones of said first and second sets of electrical connectors being connected to respective ones of said bonding pads, to thereby achieve a selected one of a plurality of different selectable circuit configurations.

2. The surface mount component as set forth in claim 1, wherein said plurality of electrical connectors are provided about the perimeter of said puck.

3. The surface mount component as set forth in claim 1, wherein said puck comprises a polygonal element, and said plurality of electrical connector comprises a plurality of spaced-apart leads extending radially outwardly from respective sides of said puck.

4. The surface mount as set forth in claim 1, wherein said comprises a generally disc-shaped element, and said plurality of electrical connectors comprises a plurality of spaced-apart leads extending radially outwardly from a circumferential edge of said puck, with an equal angular spacing therebetween.

5. The surface mount component as set forth in claim 4, wherein said plurality of possible position includes a plurality of different angular positions of said puck.

6. The surface mount component as set forth in claim 4, wherein said puck includes opposite front and back faces, and said plurality of possible positions includes a plurality of different combinations of angular and front face up/down orientations of said puck.

7. The surface mount component as set forth in claim 6, further comprising angular orientation indicia provided on said puck to facilitate easy determination of said angular orientation of said puck.

8. The surface mount component as set forth in claim 7, further comprising front face up/down indicia provided on said puck to facilitate easy determination of said front face up/down orientation of said puck.

9. The surface mount component as set forth in claim 7, wherein said angular orientation indicia comprises a first index mark provided on said front face of said puck, and a second index mark provided on said back face of said puck.

10. The surface mount component as set forth in claim 9, wherein at least two of said bonding pads are electrically connected to respective product ID pins of a microprocessor of an implantable cardiac therapy device.

11. The surface mount component as set forth in claim 4, wherein said first wiring pattern comprises a first conductive trace having a zig-zag configuration, and said second wiring pattern comprises a second conductive trace having a zig-zag configuration.

12. The surface mount component as set forth in claim 1, wherein at least two of said bonding pads are electrically connected to respective I/O pins of a microprocessor attached to said printed circuit board.

13. The surface mount component as set forth in claim 1, wherein said puck comprises:

a first dielectric layer having said first wiring pattern printed on a first surface thereof, and said second wiring pattern printed on an opposite, second surface thereof; and, a second dielectric layer bonded to said first surface of said first dielectric layer, said plurality of electrical connectors being provided on an exposed surface of said second dielectric layer.

14. The surface mount component as set forth in claim 1, wherein said first wiring pattern comprises a first conductive trace having a zig-zag configuration, and said second wiring pattern comprises a second conductive trace having a zig-zag configuration.

15. A method of using a puck to achieve a selected one of a plurality of different selectable circuit configurations of a printed circuit board having a plurality of bonding pads connected to circuitry provided on the printed circuit board, said puck having first and second wiring patterns, and a plurality of electrical connectors, a first set of electrical connectors being connected to said first wiring pattern, and a second set of said electrical connectors connected to said second wiring pattern, the method comprising the steps of:

positioning the puck on a mounting area of the printed circuit board, with a selected angular orientation corresponding to the selected circuit configuration; and, connecting at least selected ones of said electrical connectors to respective ones of said bonding pads, to thereby achieve the selected circuit configuration.

16. The method as set forth in claim 15, wherein the connecting step is carried out by soldering said at least selected ones of said electrical connectors to said respective ones of said bonding pads.

17. The method as set forth in claim 15, wherein the step of positioning the puck is carried out by using an index mark provided on at least one face of the puck.

18. A method of using a puck to achieve a selected one of a plurality of different selectable circuit configurations of a printed circuit board having a plurality of bonding pads connected to circuitry provided on the printed circuit board, said puck having a front face and a back face, first and second wiring patterns, and a plurality of electrical connectors, a first set of electrical connectors being connected to said first wiring pattern, and a second set of said electrical connectors connected to said second wiring pattern, the method comprising the steps of:

positioning the puck on a mounting area of the printed circuit board, with a selected angular orientation, and a selected front face up/down orientation, corresponding to the selected circuit configuration; and, connecting at least selected ones of said electrical connectors to respective ones of said bonding pads, to thereby achieve the selected circuit configuration.

19. The method as set forth in claim 18, wherein the connecting step is carried out by soldering said at least selected ones of said electrical connectors to said respective ones of said bonding pads.

20. The method as set forth in claim 18, wherein the step of positioning the puck is carried out by using front face up/down and angular orientation indicia provided on the puck.

* * * * *